(12) United States Patent
Schlueter et al.

(10) Patent No.: US 7,999,601 B2
(45) Date of Patent: Aug. 16, 2011

(54) CHARGE PUMP AND CONTROL SCHEME

(75) Inventors: David M. Schlueter, Lake Villa, IL (US); Cor H. Voorwinden, Toulouse (FR)

(73) Assignee: Freescale Semiconductor, Inc., Austin, TX (US)

(*) Notice: Subject to any disclaimer, the term of this patent is extended or adjusted under 35 U.S.C. 154(b) by 988 days.

(21) Appl. No.: 11/909,398

(22) PCT Filed: Apr. 1, 2005

(86) PCT No.: PCT/EP2005/004650
§ 371 (c)(1), (2), (4) Date: Sep. 21, 2007

(87) PCT Pub. No.: WO2006/102927
PCT Pub. Date: Oct. 5, 2006

(65) Prior Publication Data
US 2010/0308890 A1    Dec. 9, 2010

(51) Int. Cl.
*H03K 17/06* (2006.01)
(52) U.S. Cl. ...................................................... 327/383
(58) Field of Classification Search ................... 327/383
See application file for complete search history.

(56) References Cited

U.S. PATENT DOCUMENTS

| | | | |
|---|---|---|---|
| 5,075,572 A | 12/1991 | Poteet et al. | |
| 5,208,557 A * | 5/1993 | Kersh, III | 331/57 |
| 5,394,027 A | 2/1995 | Park | |
| 5,426,334 A | 6/1995 | Skovmand | |
| 5,808,502 A * | 9/1998 | Hui et al. | 327/333 |

FOREIGN PATENT DOCUMENTS

| | | |
|---|---|---|
| EP | 0574646 A1 | 12/1993 |
| EP | 1045519 A2 | 10/2000 |
| WO | 2006102927 A1 | 10/2006 |

OTHER PUBLICATIONS

PCT/EP2005/004650—International Search Report, with written opinion, dated Jan. 2006.

* cited by examiner

*Primary Examiner* — Lincoln Donovan
*Assistant Examiner* — Daniel Rojas

(57) ABSTRACT

A switch controller has a charge pump, a selector switch connected to the charge pump, and a pre-charge power supply input connectable to the input of the selector switch. For each of the output channels being controlled, a power control switch is connected to an output of the selector switch. In response to commands, output channels are enabled and disabled, causing corresponding actions in the power control switches. When an output channel is to be activated, the output channel is selected by the selector switch and the pre-charge power supply connected to the input of the selector switch. The charging is completed by the charge pump and the enabled status of the power control switch is maintained by the charge pump.

22 Claims, 3 Drawing Sheets

CHARGE PUMP AND CONTROL SCHEME

FIELD OF THE INVENTION

This application relates to a charge pump and switch controller and a method of controlling the same.

BACKGROUND OF THE INVENTION

Electronic devices such as microprocessors in portable devices may be placed into states of operation which minimize the power requirements when some or all of the functions of the microprocessor are not being used. The voltage applied to the microprocessor or the portions of the circuitry thereof may be controlled such that either the entire microprocessor or a selected portion thereof is unpowered. In an unpowered state, power may be dissipated by leakage currents.

Consistent with reducing the power consumption in the device for which the power is being controlled, power control apparatus may minimize power consumption through choice of components, the arrangement thereof, the sequence of operation, and other design factors. The number of components and the circuit physical area associated with the power control apparatus may be reduced. What is desired is an improved apparatus for controlling the power to multiple circuits.

SUMMARY OF THE INVENTION

The present invention provides a switch controller and a method of controlling a system as described in the accompanying claims.

DETAILED DESCRIPTION OF THE PREFERRED EMBODIMENTS

Figure 1:
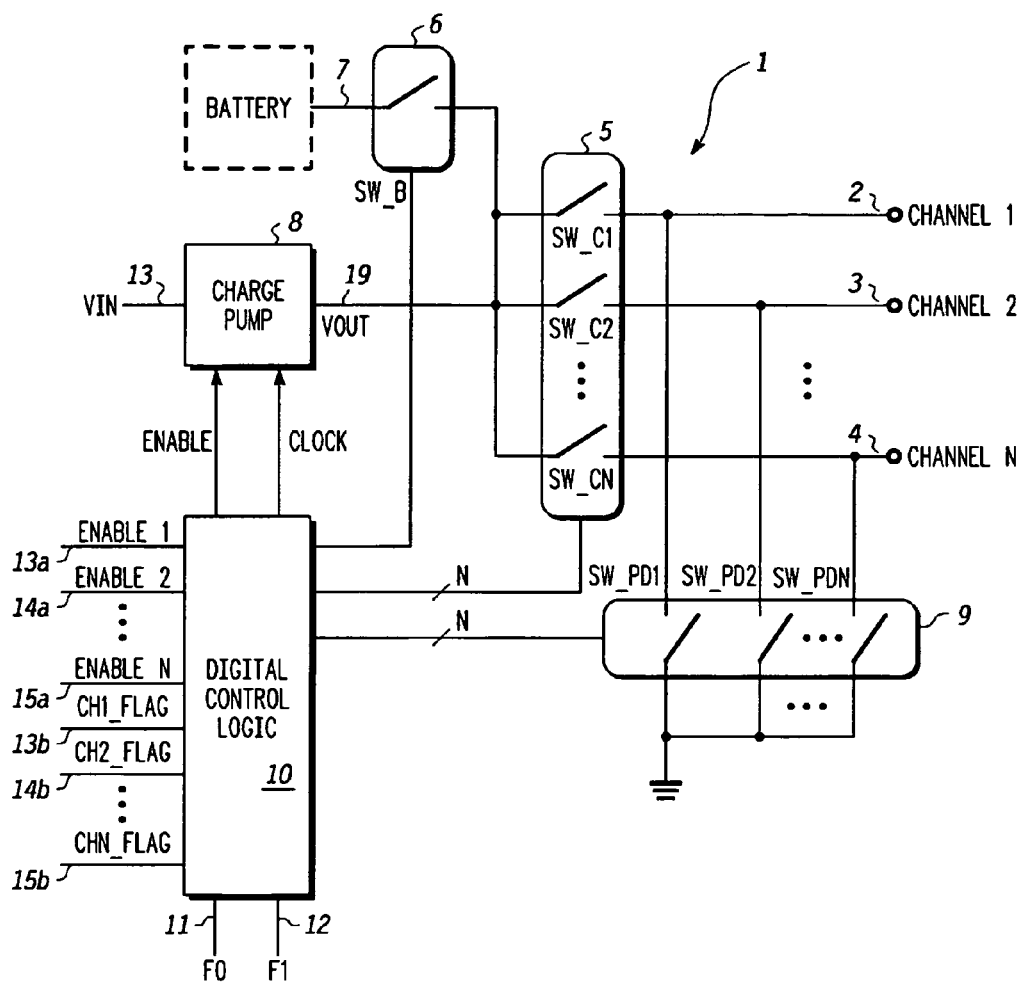
FIG. 1 is a block diagram of an example of a multi-channel charge pump and control scheme.

The power to an electronic circuit can be controlled by a switch disposed between a power supply and the electronic circuit. Multiple switches can be controlled using a charge pump to raise the voltage on a selected switch control input such that the switch closes and provides power to the circuit. One or more charge pumps can enable a larger total number of switches by selecting one or more channels to be charged or enabled by the charge pump. In order to decrease the time needed to enable the channels, the initial charging of the channel is done with a higher current capacity source, such as a battery, and the completion of the enablement is done with current supplied by the charge pump. The time duration use of the high capacity current source is set by a timer, and that of the charge pump is set by a timer or by measuring the voltage on the channels. The current needed by the voltage measurement circuit lowered by switching between a resistive voltage divider when the high capacity current source is used and a capacitive voltage divider when the charge pump is used.

A switch controller includes a charge pump, a multi-channel selector switch connected to the charge pump, a connection to a power source, the power source connection communicating with the input to the multi-channel selector switch, and a digital control circuit. The power source communicates with the input to the multi-channel selector switch through a power source switch or a diode. A multi-channel power dump switch, where each input of the power dump switch is connected to an output of the multi-channel selector switch, and the outputs of the power dump switch connected to ground sets the channel voltage to zero when the switch is in a closed position.

Control inputs to the switch controller permit the selection of individual channels or groups of channels to be enabled or disabled. A flag is provided for each of the channels to indicate the status of the channel as enabled or disabled. A channel is energized by applying the power source to the input of the multi-channel selector switch for a first determined time, disconnecting the power source, and running the charge pump for a second determined time. The times are established by the use of a timing circuit or by the measurement of the voltage on a channel or group of channels.

The voltage on an output channel or group of channels is measured during the period of operation of the charge pump by connecting the output channel to a capacitive voltage divider and comparing the voltage at a node of the capacitive voltage divider with an established reference voltage. Where the voltage at the node of the capacitive voltage divider exceeds the reference voltage is an enabled state of the channel output. The charge pump is operated in a high current output or a low current output mode depending on whether the charge pump is being used to enable a channel or to maintain the channel in an enabled state. The former is associated with a high clock rate, and the latter is associated with a lower clock rate.

An enabled state is one in which the channel voltage applied to an external device results in the external device performing a specific function, such as a switch being closed. A disabled state is one in which the channel voltage applied to an external device results in the external device performing a specific function, such as a switch being opened. The states are normally complimentary. The inverse of the switch situation is also possible, although for ease of understanding, the descriptions provided are for the situation where the enabled state corresponds to a switch being closed (the ON state) and were the disabled state corresponds to a switch being open (the OFF state).

Each of the channel outputs is connected to a control input of one or more external switches, the switches being interposed between a power supply and a circuit to be powered. In the enabled state, the channel output exhibits a voltage suitable for turning ON the external switch to which the channel output is connected.

Further, a method for controlling power to a circuit comprises the steps of providing a charge pump; providing a connection to a power source communicating with a multi-channel selector switch; connecting each output of the multi-channel selector switch to the control input of an external switch, the external switch being disposed between a power supply and a circuit; accepting inputs to enable or disable the channel outputs; and providing indicator flags of the channel output status; and responding to the command inputs as appropriate, including connecting the power source to the input to the multi-channel switch, selecting the channel to be enabled in the multi-channel switch pre-charging the channel for a determined time, disconnecting the power source and operating the charge pump to complete the enabling of the channel.

In an aspect, the supply voltage to a circuit is controlled by the use of a switch or gate. The switch controller employed to control the switch or gate is configured so as to minimize the amount of power required in order to perform each of its functions. The switch controller may consist of a charge pump, analog switches, and digital or analog control logic. Multiple circuits are controlled by the switch controller in response to external inputs, and through internal computations and measurements. A switch controller for multiple switches has a connection to an external battery or power supply, channel output terminals corresponding to the switches to be controlled and input terminals for accepting commands for determining which of the channels should be enabled or disabled. The switch controller may have output flags indicating the status of the individual channels.

The external switch or gate is any electronic device for making or breaking an electrical circuit in accordance with a control input. Such a switch is placed in series between a power source and the circuit whose power is to be controlled. A voltage applied to a switch input (gate) controls the switch, the switch being external to the switch controller, resulting in a low resistance path between the input (source) and output (drain) connections thereof. The switch is used for the entire microprocessor, or for parts thereof, or for any other electronic circuit in accordance with the specific application.

In an aspect, the switch controller is configured so that a battery, voltage regulator or other power supply, is used to provide the initial voltage to the external switch control input (gate) during a time where more current is required than when the switch is in the ON position. However, once this initial charging period has been completed, a charge pump is connected to the gate in order to complete the process of charging the gate to the desired voltage. The gate thus constitutes an external load on a channel of the multi-channel charge pump, the load characterized by a capacitance and a leakage current. As the desired voltage associated with the ON position may be greater than that provided by the battery, the charge pump is used to provide the additional current needed to reach the final voltage state.

More than one gate is controlled in this manner. The charge pump sustains the voltage on the channels associated with the selected enabled gates. A single gate or multiple gates are turned on simultaneously, according to the external control signals. Where the turn-on signals for the multiple gates are received essentially simultaneously with each other, the selected gates are turned on simultaneously by use of the battery for pre-charging and the charge pump for completion of channel charging. In an aspect, when a first gate or group of gates is being turned on, actions based on the receipt of a signal to turn on one or more additional gates may be deferred until the completion of the turn-on of the first group.

The switch controller is configured such that charging each gate or group of gates does not result in significant degradation of the voltage on gates which have already been turned on and the turn-on state of previously turned-on gates is not compromised.

The time duration of the application of the battery is controlled by a timer circuit. At the completion of the interval where the battery is connected to a gate, the battery is disconnected from the gate, and the charge pump is connected to the gate in order to complete the charging of the gate. At the completion of the charging of the gate (the gate voltage corresponding to an ON condition), a flag is set so as to be sensed at an output of the switch controller.

In another aspect, while the time duration of the application of the battery is determined by a timer or a sensed voltage, the duration of the operation of the charge pump for charging the gate may be made dependent on the actual voltage sensed at the gate. In this manner, the flag indicating that the gate has been enabled is not set unless the gate voltage has achieved a desired level. The time duration of the operation of the charge pump in order for this state to be achieved depends on the load characteristics of the gate and the charge supply capacity of the charge pump. The time duration may either be longer or shorter than the time which would have been set by a timer. Hence, the control of the flag in accordance with sensing a voltage on the gate results in avoiding setting the flag before the desired voltage has been reached while minimizing any time which might have been lost between the time that the voltage reached the desired level and the time that would have been determined by the use of a timer. The charge pump may continue to operate after the flag has been set, if there are enabled gates. The voltage of the enabled gates is maintained within a design range where leakage current exists. The external switch may include a field effect transistor (FET) having a control gate and a source and a drain connection. When a FET is used as the external switch, a channel is connected to a gate input of the FET.

In a further aspect, the switch controller is configured such that the switch controller operates in a minimum power dissipation state consistent with the desired function. For example, the charge pump operates at a high clock rate during any period when the charge pump is completing the charging of a gate during the turn-on process, and run at a low clock rate when connected to gates which are in an ON state. The sensing of the voltage of the gate during the operation of the charge pump may also be configured so as to minimize the power consumption, such as by using a capacitive divider and by disabling the voltage measurement electronics when not in use.

Exemplary embodiments are better understood with reference to the drawings, but these examples are not intended to be of a limiting nature. Like numbered elements in the same or different drawings perform equivalent functions.

FIG. 1 illustrates an example of a multi-channel charge pump 1 and control scheme, having N channels being controlled. The outputs, 2, 3, 4, represent one or more channel outputs to control individual gates or groups of gates. A switch 5 having multiple channel switches SW_C1, SW_C2 . . . , SW_CN corresponding to channels 1, . . . , N connects between the channel outputs and either the battery 7 or the charge pump 8. Where a multi-channel switch is shown, a plurality of individual switches may be equivalently used. The battery 7 is connected to the channel selection switch by a switch 6 (SW_B). The charge pump 8 may be continually connected to the input of the channel selection switch 5. A discharging (power dump) switch 9 having multiple switches (SW_PD1, . . . SW_PD2 . . . , SW_PSN) is used to discharge the voltage from a gate when the gate is in the OFF or disabled state. Where a multiple channel switch is shown, a plurality of individual switches may be equivalently be used. Alternatively, the voltage of disabled gates may be permitted to decay due to the leakage current.

Where the switches are designated as, for example, SW_CX (X being an integer between 1 and N), the switch has a value between 1 and N corresponding to the channel numbers being enabled or disabled. Multiple channels may be transitioned simultaneously from a disabled to an enabled state, or individual channels may be transitioned from a disabled to an enabled state, in response to input commands.

The switch controller incorporates digital control logic 10. The logic operates at selectable clock rates, dependent on the function being performed. In this example, two clock inputs 11, 12, correspond to F0 and F1 which are designated as a low clock rate and a high clock rate, respectively. The clock may either be internal to the multi-channel charge pump 7 or be supplied externally and shared with other circuitry. An external device determines which specific channels, or groups, of the channels are to be either turned ON or OFF.

A first example illustrates the general concept of operation. In an initial state no channels are enabled. All of the switches SW_PX of a discharge or power dump switch 9 are closed, connecting the channel outputs 2, 3, 4 to ground. The battery switch 6 and the channel selection switches SW_CX are open. When a channel is selected to be enabled, the digital control logic 10 receives an enable input for one or more channels. For example, the channel 1 enable is asserted at the input to the digital control logic 10. The digital logic operates at a clock rate F1, which may be 1 MHz. First, power dump switch SW_PD1 is opened. The battery control switch SW_B and the channel select switch SW_C1 are closed, applying the battery to pre-charge channel 1. Channel 1 has an external load connected, such as is provided by a gate input of a FET as an external switch, which may be equivalent to a capacitance of 1 nF and leakage current of 100 nA. Alternatively, a configuration of the charge pump may be used where the charge pump has an integral output capacitor or load. The connection of the battery rapidly completes a portion of the charging process (pre-charging), as the battery 7 may be able to supply more current than the charge pump. However, if the battery 7 has a lower output voltage than the charge pump, the battery 7 cannot bring the voltage at the channel 1 output terminal 2 to the desired value for controlling an external device. The selected channel becomes charged to the same voltage as the battery 7.

After a period of time, which is established by a digital timer in the digital control logic 10, the battery 7 is disconnected from the input to the channel selector switch 5 by opening the battery switch 6, and the charge pump 8 is activated. The charge pump 8 is configured to boost an input voltage. The battery 7 or another source such as a regulator in associated external circuitry supplies power to the channel selector switch 5. The output from the charge pump continues to increase the voltage appearing at the output terminal 2 until a digital tinier indicates the expected voltage should have been attained. The clock rate of the charge pump may now be reduced, and such a clock rate F0 which may be 32 kHz, so as to reduce power consumption.

In a first example, the sequence of operations of the switches, the state of the charge pump and the clock frequency of the charge pump for sequential states in the transition from all channels disabled to channel 1 enabled is shown in Table I.

TABLE I

Table I. State Table for Transition from All Channels Disabled to Channel 1 Enabled

| State | Freq | Charge Pump | SW_B | SW_C1 | SW_C2 | SW_CN | SW_PD1 | SW_PD2 | SW_PDN | Comment |
|---|---|---|---|---|---|---|---|---|---|---|
| 1 | F0 | OFF | Open | Open | Open | Open | Closed | Closed | Closed | Initialize channel outputs to zero volts thru pulldown switches, except previously enabled channels |
| 2 | F1 | OFF | Open | Open | Open | Open | Closed | Closed | Closed | Open all SW_CN switches Disable charge pump Select F1, high frequency clock to run state machine |
| 3 | F1 | OFF | Open | Open | Open | Open | Open | Closed | Closed | Open selected SW_PD switch |
| 4 | F1 | OFF | Open | Closed | Open | Open | Open | Closed | Closed | Close selected SW_CN switch |
| 5 | F1 | OFF | Closed | Closed | Open | Open | Open | Closed | Closed | Apply battery voltage to selected channel |
| 6 | F1 | OFF | Open | Closed | Open | Open | Open | Closed | Closed | Remove battery voltage from selected channel |
| 7 | F1 | ON | Open | Closed | Open | Open | Open | Closed | Closed | Apply charge pump output to selected channel Enable charge pump |
| 8 | F0 | ON | Open | Closed | Open | Open | Open | Closed | Closed | Select F0, low frequency clock |

The states of the battery switch 6 the channel select switch 5 and the power dump switch 9 change in accordance with the schedule in Table 1 in order to effect the enablement of a channel. In state 1, charge pump is off and the battery switch 6 is open. All of the switches SW_CX in the channel select switch 5 are open and all of the switches SW_PDX in the power dump switch 9 are closed. In this state, the channel outputs 2, 3, 4 are pulled down to zero volts through the associated SW_PDX switches, except if any channels were previously enabled, in which case the associated SW_PDX switches remain open. The previously enabled channels are not connected to the power dump switch 9 in this situation, else the associated channel voltages would be reduced to zero and the enabled channels would become disabled. In a second state, the clock frequency is raised to the high rate F1 to clock the digital logic 10, and all of the channel select switches 5 are open, including any switch SW_CX of a previously enabled channel.

If a channel had been previously selected, the channel output voltage would be in the ON condition. Opening the associated channel selection switch SW_CX disconnects the channel having an ON condition from the charge pump 8, and the channel voltage begins to decrease or "droop" as the charge on the channel load capacitance $C_L$ is discharged by leakage currents. The output load capacitance of a channel $C_L$ in a multi-channel switch controller 1 includes the capacitance on the output side of the multi-channel selector switch 5, and the capacitance of an external device to which the channel is connected. The leakage currents may be either internal to the switch controller 1 or associated with the external device. The remainder of the states of the enabling channel 1 operation will complete before the voltage on the channel 1 output discharges to an unacceptably low voltage level which may be associated with a change in state of the external device or an excessive change in the transfer characteristics (e.g., source-drain resistance) of the external device. At the completion of enabling of channel 1, all of the previously enabled channels are reconnected to the charge pump 8 by closing their associated channel selector switches SW_CX. At this juncture, the voltage of the already enabled channels is sustained by the charge pump 8 and the voltage increased to a level approximately equal to that prior to the operations described above. For clarity, the remainder of the discussion of this example will generally omit consideration of a previously enabled channel, unless a change in the state of the channel is made.

The term bus is used to describe an electrical connection made by a conductor between multiple components. A junction between two or more components is referred to as a node.

In state 3, the power dump switch SW_PDX for the selected channel is opened (that is SW_PD1) so that the channel 1 is no longer connected to ground. In state 4, the switch SW_CX for the selected channel (that is SW_C1) is closed so as to connect the channel output 2 to the bus to which the charge pump 8 and an output of the battery switch 6 are connected. This prepares the selected channel for charging.

In state 5, the battery switch SW_B is closed, applying the battery voltage 7 to the bus, to which the selected channel has been connected. The battery 7 is now connected to channel 1, and supplies charge to the output capacitance $C_L$ and the leakage current of the load, so that the voltage of channel 1 increases. The leakage current of the load may be considered as an equivalent resistance (not shown) in parallel with the output capacitance $C_L$. After a time interval, for example, being determined by a timer, the voltage on channel 1 has risen to a level where the remainder of the charging can be accomplished by the charge pump 8. Use of the battery for initial charging (pre-charging) may decrease the total time to bring the voltage of channel 1 to the desired ON level as the battery 7 may be able to supply a greater current than the charge pump 8. After the time interval for battery 7 application has elapsed, in state 6, the battery switch SW_B is opened to disconnect the battery 7 from the bus and, hence, from the selected channel. In state 7, the charge pump 8 is turned on, and the channel continues to charge until a second time interval has elapsed. The second time interval is selected so as to bring the expected voltage on channel 1 to the desired ON voltage level, or to a measured voltage level. Then, in state 8, the clock frequency of the charge pump 8 is reduced to the low clock rate F0. This both saves power and adjusts the rate of charge output of the charge pump 8 to a sustaining level. At this juncture, if another channel had been enabled prior to the start of the process, the associated channel selection switch SW_CX is closed, again connecting the previously enabled channel to the charge pump 8 along with channel 1. As the voltage on the previously selected channel will have drooped during state sequence described above, it will be charged back to the desired level by the charge pump 8. This voltage behavior of a previously enabled channel resulting from enabling of additional channel is termed ripple, and the depth of the discharge ripple is dependent on the channel load capacitance $C_L$ and the leakage current. A larger load capacitance results in a lower ripple, but a longer charging time.

In the following examples, the situation where a channel has been previously enabled, and for which no change in status is required, is presumed to be accommodated as described above, and will not be further described. In another example, Table II illustrates the sequence of events associated with transitioning from all channels disabled to channel 1 and channel 2 enabled.

TABLE II

Table II. State Table for Transition from All Channels Disabled to Channel 1 and Channel 2 Enabled.

| State | Freq | Charge Pump | SW_B | SW_C1 | SW_C2 | SW_CN | SW_PD1 | SW_PD2 | SW_PDN | Comment |
|---|---|---|---|---|---|---|---|---|---|---|
| 1 | F0 | OFF | Open | Open | Open | Open | Closed | Closed | Closed | Initialize channel outputs to zero volts thru pulldown switches, except previously enabled channels |
| 2 | F1 | OFF | Open | Open | Open | Open | Closed | Closed | Closed | Open all SW_CN switches Disable charge pump Select F1, high frequency clock to run state machine |
| 3 | F1 | OFF | Open | Open | Open | Open | Open | Open | Closed | Open selected SW_PD switch |
| 4 | F1 | OFF | Open | Closed | Closed | Open | Open | Open | Closed | Close selected SW_CX switch |
| 5 | F1 | OFF | Closed | Closed | Closed | Open | Open | Open | Closed | Apply battery voltage to selected channel |
| 6 | F1 | OFF | Open | Closed | Closed | Open | Open | Open | Closed | Remove battery voltage from selected channel |
| 7 | F1 | ON | Open | Closed | Closed | Open | Open | Open | Closed | Apply charge pump output to selected channel Enable charge pump |
| 8 | F0 | ON | Open | Closed | Closed | Open | Open | Open | Closed | Select F0, low frequency clock |

Comparing Tables I and II, the salient differences are that the channel selection switches SW_CX denoted SW_C1 and SW_C2 and the power dump switches SW_PDX denoted SW_PD1 and SW-PD2, corresponding to channel 1 and channel 2, are simultaneously in the same state so that both channel 1 and channel 2 are connected to the battery 7 (in state 5).

After a time interval, channel 1 and channel 2 are disconnected from the battery 7, but remain connected to the charge pump 8. The selection of clock frequency and the operation of the charge pump is as in the example of Table I. In order for two or more channels to be enabled at the same time, the commands to enable channel 1 and channel 2 are received in a sufficiently short time interval that the transition from state 1 to state 2 of the process has not commenced. If this condition on simultaneity is not met, the enablement of the channel for the later-to-arrive channel command is deferred until the completion of the enablement of the channel associated with the earlier-to-arrive channel command. This constraint permits the sequence of operations relating to the use of the battery 7 for the channel pre-charging and the charge pump 8 for the completion of charging to proceed without interruption.

Channel 1 being in an enabled state begins to discharge through the leakage resistance of the load. However, the channel will be reconnected to the charge pump 8 later, the time interval being sufficiently short that a satisfactory ON voltage continues to be maintained for the previously selected channel. In state 3, the power dump switch SW_PD2 is opened, preparatory to connecting channel 2 to the battery 7. In state 4, the channel selection switch (SW_C2) associated with the newly selected channel (channel 2 in this example) is closed so as to connect channel 2 to the bus. In state 5, the battery switch SW_B is closed, applying the battery 7 to the bus, and hence to channel 2. In an alternative, the switch SW_B is replaced by a diode, configured such that the diode is conductive when the battery voltage 7 is greater than the voltage of the channel to which it is connected. The switch approach may have a lower on-state resistance, which results in faster

TABLE III

Table III. State Table for Transition from Channel 1 Enabled to Channel 2 Enabled.

| State | Freq | Charge Pump | SW_B | SW_C1 | SW_C2 | SW_CN | SW_PD1 | SW_PD2 | SW_PDN | Comment |
|---|---|---|---|---|---|---|---|---|---|---|
| 1 | F0 | ON | OPEN | CLOSED | OPEN | OPEN | OPEN | CLOSED | CLOSED | Initialize channel outputs to zero volts thru pulldown switches, except previously enabled channels |
| 2 | F1 | OFF | OPEN | OPEN | OPEN | OPEN | OPEN | CLOSED | CLOSED | Open all SW_CN switches Disable charge pump Select F1, high frequency clock to run state machine |
| 3 | F1 | OFF | OPEN | OPEN | OPEN | OPEN | OPEN | OPEN | CLOSED | Open selected SW_PD switch |
| 4 | F1 | OFF | OPEN | OPEN | CLOSED | OPEN | OPEN | OPEN | CLOSED | Close selected SW_CX switch |
| 5 | F1 | OFF | CLOSED | OPEN | CLOSED | OPEN | OPEN | OPEN | CLOSED | Apply battery voltage to selected channel |
| 6 | F1 | OFF | OPEN | OPEN | CLOSED | OPEN | OPEN | OPEN | CLOSED | Remove battery voltage from selected channel |
| 7 | F1 | ON | OPEN | OPEN | CLOSED | OPEN | OPEN | OPEN | CLOSED | Apply charge pump output to selected channel Enable charge pump |
| 8 | F0 | ON | OPEN | CLOSED | CLOSED | OPEN | OPEN | OPEN | CLOSED | Select F0, low frequency clock |

In another example, Table III illustrates the sequence of events associated with enabling channel 2 where channel 1 has been previously enabled. In state 1, as channel 1 has previously been brought to a condition where the channel voltage corresponds to an ON state, the charge pump 8 is in the ON state in order to maintain the voltage on channel 1, and the clock rate of the charge pump 8 is in the low clock rate state F0, if it is desired to conserve power. SW_C1 is in the closed state to permit the charge pump 8 to operate so as to supply charge to prevent discharge of the channel voltage through the load leakage resistance. SW_PD1 is in an open state so that channel 1 is not pulled down to ground. However, the remaining switches SW_CX are in an open state and the remaining SW_PDN are in a closed state such that the associated channel voltages are zero. In state 2, all of the SW_CX switches are placed in an open state, disconnecting the enabled channel 1 from the bus, and the clock frequency of the charge pump 8 is increased to the high rate clock F1.

charging of the channel voltage, and a lower leakage resistance when in the off state, which may minimize power consumption.

In state 6, which occurs after a time interval determined by a timer or other means, SW_B is opened, disconnecting the battery 7 from the channel. Subsequently, in step 7, the charge pump 8 is turned on, and operated with the high speed clock F1 in order to complete the charging of the channel. After a time interval determined by a timer or other means, the charging is considered to have been completed and the previously selected channel (that is, channel 1) is reconnected to the charge pump 8 by closing SW_C1, the newly enabled channel (that is, channel 2) remaining connected to the charge pump 8. The clock frequency may be reduced to the low frequency value F0 such that the charge pump 8 provides sustaining current, while minimizing power consumption.

In another aspect, a channel that has been enabled may be disabled. Such a sequence of events is shown in Table IV.

TABLE IV

Table IV. State Table for Transition from Channel 1 and Channel 2 Enabled to Channel 2 Disabled.

| State | Freq | Charge Pump | SW_B | SW_C1 | SW_C2 | SW_CN | SW_PD1 | SW_PD2 | SW_PDN | Comment |
|---|---|---|---|---|---|---|---|---|---|---|
| 1 | F0 | ON | Open | Closed | Closed | Open | Open | Open | Closed | Initialize channel outputs to zero volts thru pulldown switches, except previously enabled channels |

TABLE IV-continued

Table IV. State Table for Transition from Channel 1 and Channel 2 Enabled to Channel 2 Disabled.

| State | Freq | Charge Pump | SW_B | SW_C1 | SW_C2 | SW_CN | SW_PD1 | SW_PD2 | SW_PDN | Comment |
|---|---|---|---|---|---|---|---|---|---|---|
| 2 | F0 | ON | Open | Closed | Open | Open | Open | Closed | Closed | Open selected SW_CX switches Close selected SW_PD switch via analog delay |

Consider the situation where channels 1 and 2 have been enabled and channel 2 is commanded to be disabled. As shown in FIG. 1, the enable command is asserted at individual inputs to the digital control logic 10, a disable request being the complement of an enable request. Although the interface for these requests 13a, 14a, 15a and for the status flags 13b, 14b, 15b is shown as discrete connections, the interface is any digital interface known in the art, such as a serial interface.

In state 1, the charge pump 8 may operate at the low clock rate F0, as the charge pump 8 is in the sustaining mode of operation, the battery switch 6 or diode (not shown) is in an open position as the channels are in either a enabled or a disabled state. The channel select switches SW_C1 and SW_C2 are in a closed position as channels 1 and 2 of the N channels have been enabled. Further, the switches of the SW_PDX (X not equal to 1, 2) are in the closed position as, except for channels 1 and 2, the remaining channels are not enabled. In state 2, the switch SW_C2, corresponding to the channel 2 (which is being disabled) is opened, disconnecting channel 2 from the bus and the charge pump 8. After a time delay (so that SW_C2 opens before SW_PD2 closes), the corresponding power dump switch SW_PD2 is closed, connecting the channel to ground and discharging channel 2. The time delay is established by a digital timer or an analog timer. The sequence of switch operations is characterized as break-before-make, so that channel 2 is isolated from the remainder of the channels prior to connecting channel 2 to ground. This avoids grounding other enabled channels connected to the bus and the charge pump 8.

In an aspect, a channel which has previously been enabled may be disabled at any time, since the opening of the channel select switch SW_CX (in this example SW_C2) disconnects the channel from the charge pump 8 prior to the closing of the power dump switch SW_PD2.

The control scheme previously described may permit the rapid charging of one channel or a group of channels which have been essentially simultaneously commanded to be enabled, by applying a battery 7 or other higher current capacity source to the channel capacitive load $C_L$ and leakage resistance, and then completing the charging of the channel using a charge pump 8 having a higher voltage capability than the higher current capacity source 7; then the clock rate of the charge pump 8 is reduced to the low clock rate F0 to supply a sustaining current to the enabled channels, while minimizing the overall power dissipation of the switch control circuit. When in the sustaining mode, the charge pump 8 supplies current to make up that which is associated with the leakage resistance of the loads connected to the enabled channels. If no channels are enabled, the charge pump 8 may be turned OFF.

Channel select switch 5, battery switch 6 and power dump switch 9 are illustrated as conventional switches, but may be semiconductor switches such as field effect transistors (FET), which are known in the art. The charge pump 8, the digital control logic 10, and the switches 5, 6 and 9 may be part of an integrated circuit, in whole or in part.

Figure 2:
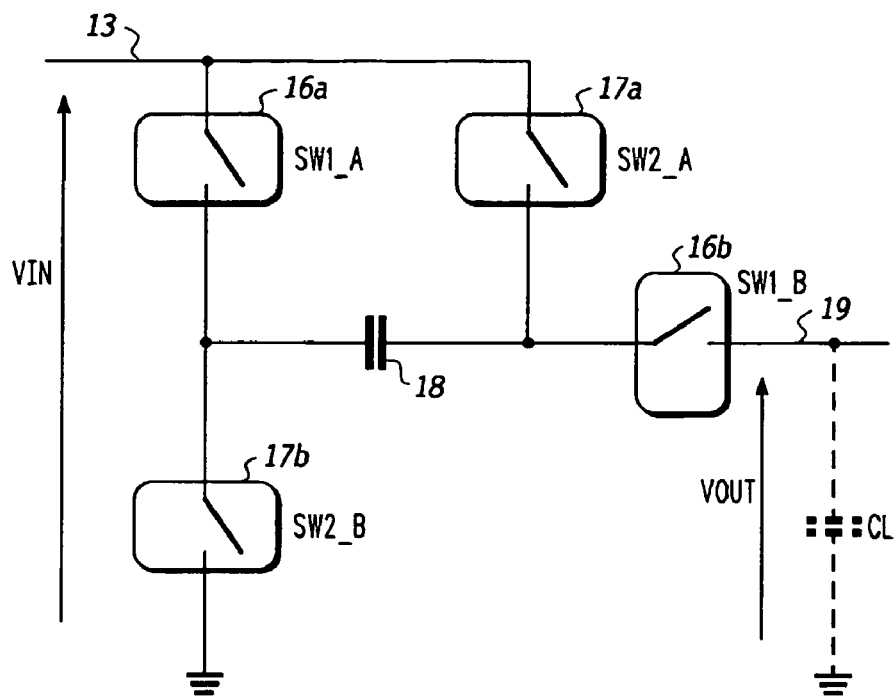
FIG. 2 is a diagram of a charge pump using the load capacitance as an output capacitance in one embodiment.

Charge pump 8 is any of the designs known in the art for boosting an input voltage to a larger output voltage. In an aspect, the charge pump 8 may be of the form shown in FIG. 2, having a configuration where only one capacitor 18 is used. In this configuration, the capacitance of the load $C_L$ connected to an output channel serves as a second capacitor. A supply voltage $V_{in}$ is applied at an input terminal 13 and the charge pump 8 outputs a higher voltage $V_{out}$ at the output terminal 19. Switches 16a and 16b operate together, and switches 17a and 17b operate together on cycles of the clock frequency, such that switches 16a, b are closed when switches 17a, b are open, and vice versa. In this manner, charge is imposed on the internal capacitor 18 of the charge pump 8 by the supply voltage $V_{in}$ when switches 17a, b are in the closed position and switches 16a, b are in the open position, and the charge is transferred to the output capacitor (in this case the external load capacitance $C_L$) when switches 17a, b are in the open position and switches 16a, b are in the closed position.

Figure 3:
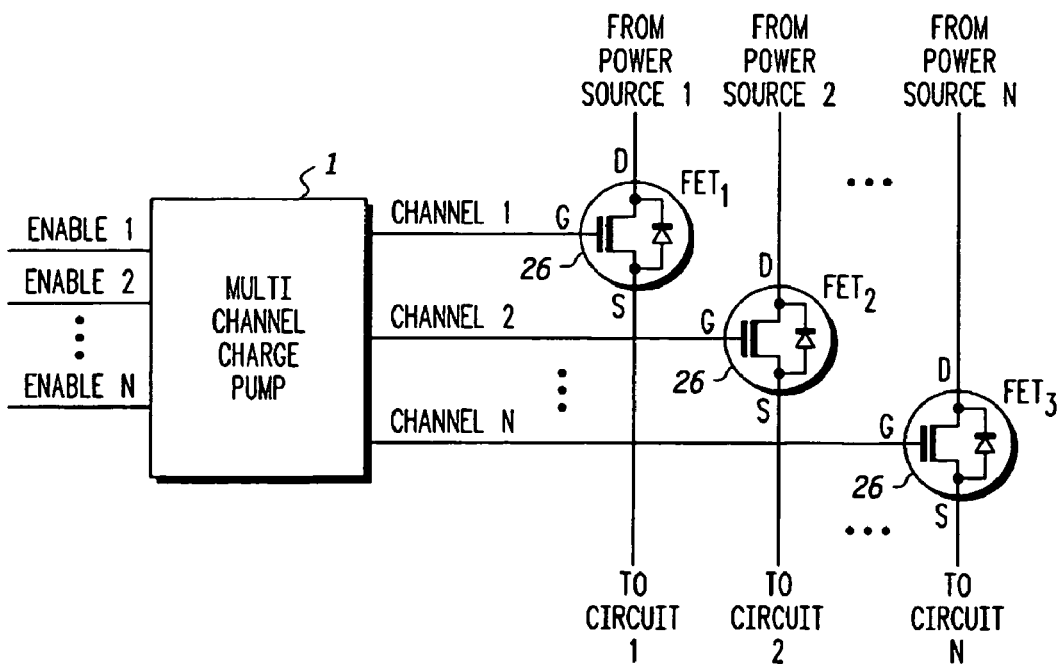
FIG. 3 is a diagram of a system of one embodiment with a multi-channel charge pump and a power switch.

FIG. 3 illustrates the use of the apparatus of FIG. 1 in the control of power to another circuit. Such a circuit may be a microprocessor, a memory, a programmable controller, or any other analog or digital circuitry which is configured such that the power thereto can be independently controlled.

The output of a channel, channel 2 for example, is connected to an external switch 26 such that the state of the external switch 26 is changed from OFF to ON depending on the state of the voltage on channel 2. The external switch 26 may be located on the same substrate, or incorporated in the same circuit as the switch controller 1 or may be a separate device. In an aspect, the external switch 26 is a NFET such as a Fairchild FDZ289N (available from Fairchild Semiconductor Corporation), the external switch 26 being disposed between a power supply (not illustrated) and the circuit (not illustrated) whose power is being controlled. The power supply may be a buck or boost switcher or other power source as is known in the art and the circuit may be a processor, a part thereof, or any electrical circuit whose power is to be controlled.

When a NFET such as the Fairchild FDZ289N is used as an external switch 26, a nominal load capacitance $C_L$ of approximately 1 of and a leakage current on the ON condition of approximately 100 nA is experienced when a channel is connected to the gate terminal G of the external switch 26. The discharge time of an enabled channel, when it is disconnected from the charge pump 8 during the enablement of other channels is sufficiently long so that the external switch 26, associated with the previously enabled channel, remains in the ON condition until the process of enabling additional external switches 26 is competed. That is, the ripple, or voltage drop, in the voltage at the gate terminal G of external switch 26 is sufficiently low so as to continue to maintain the external switch 26 in the ON position, as characterized by a low resistance between the input and output connections (source S and drain D) thereof.

In another aspect, the control of the charging time associated with the battery 7 pre-charging of a channel and of the charge pump 8 is based on measurement of the voltage on the channel being enabled. By measuring the voltage on the channel, an indication that the channel has been enabled can be made as soon as the channel has reached the design operating voltage for turning the external switch 260N, rather than a preset time. This takes account of variations in load capacitance $C_L$ and leakage resistance of the load and the switch controller 1 due to production variations and temperature, so that the channel enabled flag 13b, 14b, 15b is set based on the actual voltage on the channel. Using a fixed time interval for the activation may result in the flag 13b, 14b, 15b being set prior to the channel voltage reaching a suitable level, or a delay in setting the flag 13b, 14b, 15b for a period after the channel voltage has reached a suitable level.

Resistive voltage dividers may be used for the purpose of measuring the channel voltage. If the current drawn by the resistive divider is limited to 100 nA at a potential of 5.7 volts, the resistive divider will have a resistance of at least 57 Mohms. In this situation, the current associated with a resistive divider is comparable to the leakage current of the external switch 26 as previously described. A high resistance may be disadvantageous in manufacturing aspects associated with matching resistor values and achieving design tolerances. However, a resistive divider having lower overall resistance can be used during the initial charging (pre-charging) of a channel, by a battery 7 or similar power supply having a higher output current capacity than the charge pump 8. Subsequently, when the charging process is being completed by the charge pump 8, a capacitive divider is used, where the capacitances are selected so as to minimize the additional current load on the charge pump 8. The voltage monitoring circuit shown in FIG. 4 measures the voltage on the channel or group of channels being activated to determine when the channel voltage has reached a predetermined threshold value, such as 5.7 volts. The threshold value may depend on the external switch 26 characteristics.

Figure 4:
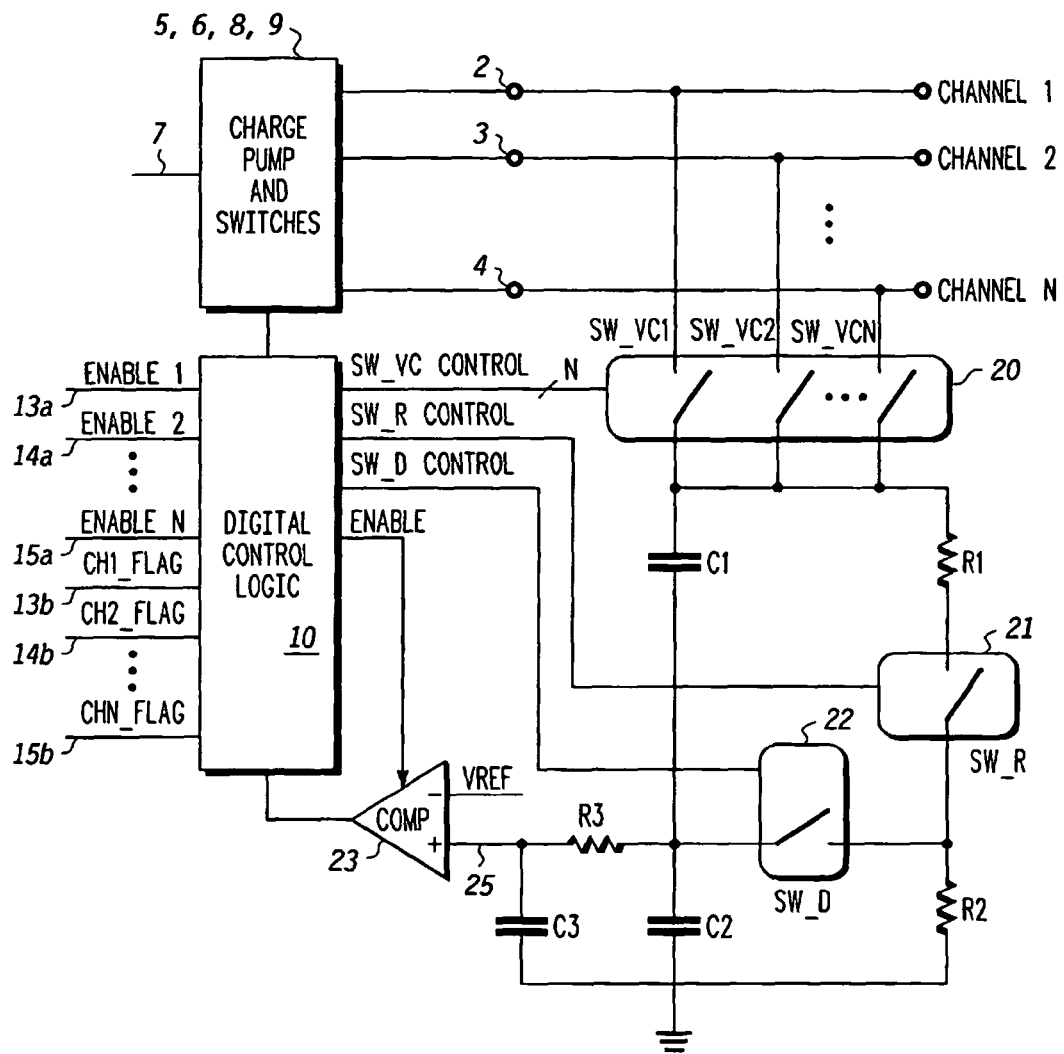
FIG. 4 is a block diagram of an aspect of the multi-channel charge pump relating to the measurement of output channel voltage.

In an aspect, shown in FIG. 4, the voltage at the channel outputs 2, 3, 4 of a switch controller 1 are monitored by a resistive divider network R1, R2, a capacitive divider network C1, C2, C3, a comparator 23, switches 20, SW_D, SW_R and the digital control logic 10. The aspects of the switch controller 1 and the selection of channels to be activated shown in FIG. 1 are all not repeated here. FIG. 3 shows aspects of the voltage measurement apparatus, which may be connected to the channel outputs 2, 3, 4. The components of the voltage measurement apparatus may be disposed on the same integrated circuit as the charge pump 8 and the external switch 26, or may be separate components or circuits.

The sequence of voltage measurement starts in a state in which switches 20, SW_R of the voltage measurement apparatus are open, and SW_D, is closed, permitting capacitors C2, C3 to discharge through resistor R2. When a channel or group of channels is enabled and is being charged, the resistive divider network comprising R1 and R2 is connected to the selected output channel 2, 3, 4 by closing the appropriate switches SW_VCX, which are part of the switch 20. The comparator circuit 23 is activated by an enable command from the digital control logic 10. One input of the comparator circuit 23 is $V_{ref}$, which is the voltage at which the comparator is set to trip and provide an output to the digital control logic 10. Another input to the comparator 23 is an output of the resistive and capacitive divider circuits, shown as a node between C3 and R3.

At this time, the battery voltage 7 or other power source is applied to the channels being enabled, as has previously been described. The resistive divider comprised of R1 and R2 has a total resistance such that the current flow at the battery 7 potential is lower than the total current capacity of the battery 7, and current can be supplied both to charge the load capacitors $C_L$ of the selected channels and through the resistive divider R1, R2. The battery 7 remains connected to the selected channels for a time interval which is determined by a timer which may be part of the digital control logic 10. At the conclusion of charging of the selected enabled channels by the battery 7, a period which may termed pre-charging or initial charging, the battery 7 is disconnected, and SW_R and SW_D are opened so as to disconnect the selected enabled channels being charged from the resistive divider R1, R2. Capacitors C1, C2 and C3 which comprise the capacitive divider were already connected to the selected enabled channels through closed switches SW_VCX which correspond to the enabled channels being charged. Opening of SW_D disconnects R2 from the component network and the charge on C2 and C3 remains. Similarly, opening SW_R disconnects C1 from R2, and the charge remains on C1. Hence, the voltage on the capacitive divider C1, C2, C3 represents the voltage at the time that the battery 7 is disconnected from the channels being charged.

The charge pump 8 is now activated and applied to the channels currently in the process of being enabled, as previously described. The charge pump 8 delivers charge to the external loads $C_L$ on the channels being enabled as well as to the capacitive divider of the voltage measurement circuit. The voltage at each of the channel loads $C_L$ of the channels being enabled and the node between the capacitor C1 and the switch 20 are the same, being connected together at this time. This condition permits the capacitive divider C1, C2, C3 to represent the voltage of the channels now being charged. As the value of the voltage across the capacitive divider C1, C2, C3 increases due to the additional charge being transferred from the charge pump 8, the corresponding voltage at an input 25 from a node of the capacitive divider C1, C2, C3 to the comparator 23 increases from the value which obtained at the conclusion of the interval where the battery was connected to the channels being enabled.

After a time, the voltage at the node of the capacitive divider connected to an input 25 of the comparator exceeds the voltage reference $V_{ref}$ and the comparator 25 trips and outputs this indication to the digital control logic 10. The digital control logic 10 then outputs flags 13b, 14b, 15b for the enabled channels, indicating that the channel voltage has reached a state corresponding to an ON or enabled condition of the external switch 26. The comparator 23 may then be disabled in order to save power, and the switches SW_VCX corresponding to the channels whose charging has been completed opened, disconnecting the channels from the voltage divider networks. Switch SW_D is now be closed so as to discharge capacitors C2 and C3.

Capacitors C2 and C3 form a lower leg of the capacitive divider, and R3 is inserted between the two capacitors in order to form an analog filter to smooth the voltage waveform applied to the input 25 of the comparator, reducing the effect of transient noise on the operation of the comparator 23.

An example illustrates the operation of the voltage measurement circuit. Table V illustrates the sequence of operations relating to the transition from all channels disabled to channel 1 enabled.

TABLE V

Table V. State Table for Voltage Measurement in Transition from All Channels Disabled to Channel 1 Enabled.
SC14063ZC-PCT Spec Vfinal 1 Apr. 2005

| State | SW_VC1 | SW_VC2 | SW_VCN | SW_R | SW_D | Comment |
|---|---|---|---|---|---|---|
| 1 | Open | Open | Open | Open | Closed | Initialize feedback network to discharge bottom capacitors. Capacitors C2 and C3 will discharge thru R2 and R3 to ground |
| 2 | Closed | Closed | Open | Open | Closed | Close selected SW_VCX switch. Enable comparator |
| 3 | Closed | Closed | Open | Closed | Closed | Close SW_R switch. Remain closed until the application of battery is removed |
| 4 | Closed | Closed | Open | Closed | Open | Open SW_D Switch |
| 5 | Closed | Closed | Open | Open | Open | Open SW_R switch. Charge pump is enabled during this period. Wait for comparator to trip |
| 7 | Open | Open | Open | Open | Open | Open selected SW_CX switch. Let digital control send completion flag to other circuits |
| 8 | Open | Open | Open | Open | Closed | Close SW_D switch to discharge capacitors. Disable comparator |

In state 1, the all of the switches of the channel switch 20 are in the open position and SW_D is closed. Capacitors C2 and C3 will have been previously discharged to ground through R2 and R3. In state 2, SW_VC1, corresponding to the channel being enabled, is closed and the comparator is enabled. However, the comparator need not be enabled until at least the end of step 4. In state 3, SW_R is closed, completing the resistive divider circuit. At this juncture, the voltage across the resistive divider comprised of R1 and R2 and the voltage across the capacitive divider comprised of C1 in series with the parallel combination of C2 and C3 become equal. In state 4, SW_D is opened so as to disconnect the capacitive divider from the resistive divider. In state 5, SW_R is opened, effectively removing the resistive divider from the voltage measuring circuit. Now that the resistive divider is no longer drawing current, the charge pump 8 is enabled to complete the charging of the enabled channel. The process remains in state 5 as the voltage of the channel being enabled rises, along with a corresponding rise in the voltage applied to the input 25 of the comparator 23 from the node of the capacitive voltage divider, until the threshold set by $V_{ref}$ is exceeded.

Progressing to state 7 on this event, the comparator 23 outputs the change to the digital control logic 10 and the circuit charging complete flag 13b set to signal this situation to other circuits. The connection between the voltage dividers and the channel being enabled is opened by opening SW_VC1. In state 8, switch SW_D is closed such that the capacitors C2 and C3 are discharged, and the comparator 23 may also be disabled.

In another example, illustrated in Table VI, channels 1 and 2 are commanded to be enabled essentially simultaneously. In such a situation, both channel 1 and channel 2 are charged at the same time. The voltage comparator 23 is employed to measure the charging status of both of the channels that have been selected for charging. Since both of the channels are to be enabled, it is expected that both of the channels will reach the desired ON voltage essentially simultaneously. Consequently, the comparator 23 is used to measure the voltage on the two channels. The sequence of operations for this example is similar to that of the previous example, and only salient differences are mentioned.

TABLE VI

Table VI. State Table for Voltage Measurement for Transition from All Channels Disabled to Channel 1 and Channel 2 Enabled.

| State | SW_VC1 | SW_VC2 | SW_VCN | SW_R | SW_D | Comment |
|---|---|---|---|---|---|---|
| 1 | OPEN | OPEN | OPEN | OPEN | CLOSED | Initialize feedback network to discharge bottom capacitors. Capacitors C2 and C3 will discharge thru R2 and R3 to ground |
| 3 | CLOSED | OPEN | OPEN | OPEN | CLOSED | Close selected SW_VCX switch. Enable comparator |
| 3 | CLOSED | OPEN | OPEN | CLOSED | CLOSED | Close SW_R switch. Remain closed until the application of battery is removed |
| 4 | CLOSED | OPEN | OPEN | CLOSED | OPEN | Open SW_D Switch |
| 5 | CLOSED | OPEN | OPEN | OPEN | OPEN | Open SW_R switch. Charge pump is enabled during this period. Wait for comparator to trip |
| 7 | OPEN | OPEN | OPEN | OPEN | OPEN | Open selected SW_VCX switch. Let digital control send completion flag to other circuits |

TABLE VI-continued

Table VI. State Table for Voltage Measurement for Transition from All Channels Disabled to Channel 1 and Channel 2 Enabled.

| State | SW_VC1 | SW_VC2 | SW_VCN | SW_R | SW_D | Comment |
|---|---|---|---|---|---|---|
| 8 | OPEN | OPEN | OPEN | OPEN | CLOSED | Close SW_D switch to discharge capacitors<br>Disable comparator |

In state 2, both SW_VC1 and SW_VC2 are closed. This has the effect of connecting both channel 1 and channel 2 together, as well as to the upper node of the voltage dividers. Channel 1 and channel 2 are charged together, and reach the desired ON voltage condition simultaneously even if their load capacitances $C_L$ and leakage currents differ. This is sensed in state 5 where the comparator 23 outputs the result to the digital control logic 10. At this juncture, the switches SW_VC1 and SW_VC2 are opened, thus separating the two channels from each other and from the voltage dividers. Since both channel 1 and channel 2 have been charged to the appropriate voltage, the flags 13b and 14b are set.

The channel voltage select switch 20, the resistive divider switch SW_R and the capacitive divider discharge switch SW_D are illustrated as conventional switches, but may be semiconductor switches such as a FET, which are known in the art.

The voltage sensing circuit therefore measures the voltage during the charging period of a channel or a group of channels which have been essentially simultaneously selected. Should further channels be selected during the charging operation, the charging of the additional channels is deferred until the completion of the charging of the previously selected channels. In consequence, the voltage measurement operation is coordinated with the charging operation so that the voltage measurement circuit continues to be connected to the channels being charged until the charging has been completed.

Although the present invention has been explained by way of the examples described above, it should be understood to the ordinary skilled person in the art that the invention is not limited to the examples, but rather that various changes or modifications thereof are possible without departing from the spirit of the invention. Accordingly, the scope of the invention shall be determined only by the appended claims and their equivalents.

The invention claimed is:

1. A switch controller comprising:
   a charge pump configured to provide a first charge voltage;
   a selector switch, an input of the selector switch connected to the charge pump and the selector switch operable to connect to an output channel for charging the output channel; and
   a power source connection communicating with the input to the selector switch, wherein the power source connection provides power at a second charge voltage, wherein the second charge voltage is less than the first charge voltage, wherein during an enablement of the channel from a disabled state, the selector switch provides power from the power source connection to charge the output channel from a disabled state to a voltage below the first charge voltage and subsequently provides power from the charge pump to charge the output channel to the first charge voltage.

2. The switch controller as in claim 1, wherein the selector switch is one of a plurality of first switches, each of the plurality of first switches operable to connect to one of a plurality of output channels to enable the one of the plurality of output channels with charge current from the power source connection and from the charge pump, and an input of each of the plurality of first switches connected with the charge pump.

3. The switch controller as in claim 1, wherein the selector switch is implemented in a multi-channel switch circuit, an output of the multi-channel selector switch circuit operable to connect to one of a plurality of output channels.

4. The switch controller as in claim 1, wherein the power source connection communicates with the input of the selector switch through a power source switch.

5. The switch controller as in claim 1, wherein the charge pump is operable at a high clock rate and a low clock rate.

6. The switch controller as in claim 5, wherein the high clock rate and the low clock rate are selectable by a control circuit.

7. The switch controller as in claim 6, wherein the charge pump operates at the high clock rate when the output channel is being enabled.

8. The switch controller in claim 1, wherein an external load capacitance is used as an output capacitor of the charge pump.

9. The switch controller as in claim 1, further comprising a power dump switch, an input of said power dump switch connectable to the output channel and an output of said power dump switch connected to a ground.

10. The switch controller as in claim 9, wherein the power dump switch is one of a plurality of second switches, each of the plurality of second switches having an input connectable to one output channel of a plurality of output channels, and each of the plurality of second switches having an output connected to the ground.

11. The switch controller as in claim 1, further comprising a digital control circuit, wherein the digital control circuit has an output flag indicating the status of each output channel.

12. The switch controller as in claim 1, wherein a status of the output channel is determined by measuring a voltage of the output channel.

13. The switch controller according to claim 1, wherein more than one output channel is enabled simultaneously in response to commands received by a digital control circuit.

14. A switch controller comprising:
   a charge pump;
   a selector switch, an input of the selector switch connected to the charge pump and the selector switch operable to connect to an output channel; and
   a power source connection communicating with the input to the selector switch;
   wherein a status of the output channel is determined by measuring a voltage of the output channel;
   wherein the voltage measuring circuit comprises:
      a resistive voltage divider;
      a capacitive voltage divider;
      a comparator communicating with the resistive voltage divider and the capacitive voltage divider.

15. A method of controlling a system, the method comprising:
- selecting a channel of a multi-channel system to be enabled;
- connecting a power supply to the channel to be enabled to charge the channel with the power supply from a disabled state;
- disconnecting the power supply to the channel to be enabled wherein when disconnected, the channel is charged to a first voltage; and
- operating a charge pump connected the channel to be enabled to charge the channel to a higher voltage than the first voltage.

16. A method of controlling a system, the method comprising:
- selecting a channel of a multi-channel system to be enabled;
- connecting a power supply to the channel to be enabled;
- disconnecting the power supply to the channel to be enabled; and
- operating a charge pump connected the channel to be enabled;
- wherein the disconnecting the power supply corresponds to the expiration of a timer.

17. The method of claim 15, wherein the charge pump is operable at a high clock rate between the disconnecting the power supply and completion of enabling the channel.

18. The method of claim 15, wherein the completion of enabling the output channel is determined by a measurement of a voltage on the channel to be enabled.

19. A method of controlling a system, the method comprising:
- selecting a channel of a multi-channel system to be enabled;
- connecting a power supply to the channel to be enabled;
- disconnecting the power supply to the channel to be enabled; and
- operating a charge pump connected the channel to be enabled;
- wherein the completion of enabling the output channel is determined by a measurement of a voltage on the channel to be enabled;
- wherein the method further comprises providing a comparator, a resistive divider and a capacitive divider, and measuring the voltage of the channel to be enabled using the resistive voltage divider and comparator when the power supply is connected to the channel to be enabled, and measuring the voltage of the channel to be enabled using the capacitive voltage divider when the power supply is disconnected from the channel to be enabled.

20. The method of claim 15, wherein the channel is disabled by deselecting the channel and connecting the channel to a ground.

21. The method of claim 15, wherein more than one channel is enabled simultaneously.

22. The method of claim 15, wherein when a first output channel is being enabled, a second output channel being enabled is delayed until the enabling of the first output channel has been completed.

* * * * *